US008507981B2

United States Patent
Chen et al.

(10) Patent No.: US 8,507,981 B2
(45) Date of Patent: Aug. 13, 2013

(54) METHOD OF MANUFACTURING NMOS TRANSISTOR WITH LOW TRIGGER VOLTAGE

(75) Inventors: Lu-An Chen, Keelung (TW); Tai-Hsiang Lai, Miaoli County (TW); Tien-Hao Tang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/271,239

(22) Filed: Oct. 12, 2011

(65) Prior Publication Data
US 2013/0093009 A1    Apr. 18, 2013

(51) Int. Cl.
*H01L 29/76*    (2006.01)
*H01L 31/062*    (2012.01)

(52) U.S. Cl.
USPC ........... 257/335; 257/337; 257/341; 257/401; 438/197

(58) Field of Classification Search
USPC .................. 257/335, 337, 341, 401, E21.417; 438/197
See application file for complete search history.

(56) References Cited

U.S. PATENT DOCUMENTS

| | | |
|---|---|---|
| 5,637,900 A | 6/1997 | Ker |
| 5,959,820 A | 9/1999 | Ker |
| 6,724,677 B1 | 4/2004 | Su |
| 6,909,149 B2 | 6/2005 | Russ |
| 7,009,252 B2 | 3/2006 | Lin |
| 7,027,276 B2 | 4/2006 | Chen |
| 7,205,612 B2 | 4/2007 | Cai |
| 7,368,761 B1 | 5/2008 | Lai |
| 7,635,614 B1 | 12/2009 | Kuznetsov |
| 7,672,100 B2 | 3/2010 | Van Camp |
| 7,838,937 B1 | 11/2010 | Walker |
| 2003/0076636 A1 | 4/2003 | Ker |
| 2006/0267102 A1 | 11/2006 | Cheng |
| 2007/0278568 A1* | 12/2007 | Williams et al. ............... 257/335 |

* cited by examiner

Primary Examiner — Theresa T Doan
(74) Attorney, Agent, or Firm — Winston Hsu; Scott Margo

(57) ABSTRACT

A method for forming an NMOS transistor includes forming a P-substrate; forming an N-well on the P-substrate; forming an N-drift region on the N-well; forming an n+ drain on the N-drift region; forming a plurality of first contacts on the n+ drain along a longitudinal direction; forming a P-body on the N-well; forming a source on the P-body, the source including a plurality of n+ doped regions and at least one p+ doped region arranged along the longitudinal direction; forming a plurality of second contacts on the plurality of n+ doped regions and the at least one p+ doped region; forming a polygate on the P-body; and forming a gate oxide between the polygate and the source.

10 Claims, 6 Drawing Sheets

US 8,507,981 B2

METHOD OF MANUFACTURING NMOS TRANSISTOR WITH LOW TRIGGER VOLTAGE

BACKGROUND OF THE INVENTION

1. Field of the Invention

The present invention relates to a metal-oxide-semiconductor (MOS) transistor, especially referred to an n-type metal-oxide-semiconductor (NMOS) transistor and the manufacturing method thereof.

2. Description of the Prior Art

MOS transistors are among most commonly used semiconductor components. MOS transistors include vertical double-diffused MOS (VDMOS) and laterally-diffused MOS (LDMOS). Because LDNMOS transistors have higher operation bandwidth, higher operation efficiency, and a flat structure that can be easily integrated with other integrated circuits, LDNMOS transistors are widely used in high voltage environment, such as in a CPU power supply, power management system, AC/DC converter and high power or high frequency power amplifier. The operation characteristics of LDNMOS transistors are similar to those of NMOS transistors. The difference between them is that the N-drift region of an NMOS transistor is highly doped while the N-drift region of an LDNMOS transistor is lowly doped. This makes the N-drift region of the LDNMOS bear most voltage drop between the drain and gate, reducing the high electric field between the drain and gate, and resulting in a high breakdown voltage of the LDNMOS transistor.

Please refer to FIG. 1, FIG. 1 shows a prior art open drain circuit 100. As depicted in FIG. 1, an internal circuit 10 in the open drain circuit 100 is connected to an output driving element 11. The electro-discharge effect usually occurs at the input contact 15, output contact 16, high voltage contact 13 and low voltage contact 14. To prevent the output driving element 11 from electro-discharge damage, the ESD clamp 12 is added to protect the open drain element 11. Because the trigger voltage of the ESD clamp 12 is usually lower than that of the output driving element 11, the electro-discharge current will pass through the ESD clamp 12 rather than the output driving element 11.

The ESD clamp 12 is usually made of NMOS transistors. The low trigger voltage of the NMOS transistor allows the NMOS transistor to discharge more quickly thereby demonstrating a high performance of the ESD clamp 12 to protect the open drain element 11. A typical approach to further improve the performance of the ESD clamp 12 is to reduce the channel length of the NMOS transistor so as to reduce the breakdown voltage of the NMOS transistor. However, reducing the channel length of the NMOS transistor will cause the NMOS transistor to leak current, reducing the reliability of the NMOS transistor.

SUMMARY OF THE INVENTION

An embodiment of the present invention provides a method for forming an NMOS (n-type metal-oxide-semiconductor) comprising forming a P-substrate; forming an N-well on the P-substrate; forming an N-drift region on the N-well; forming an n+ drain on the N-drift region; forming a plurality of first contacts on the n+ drain along a longitudinal direction; forming a P-body on the N-well; forming a source on the P-body, the source comprising a plurality of n+ doped regions and at least one p+ doped region arranged along the longitudinal direction; forming a plurality of second contacts on the plurality of n+ doped regions and the at least one p+ doped region; forming a polygate on the P-body; and forming a gate oxide between the polygate and the source.

Another embodiment of the present invention provides an NMOS (n-type metal-oxide-semiconductor) comprising a P-substrate; an N-well on the P-substrate; an N-drift region on the N-well; an n+ drain on the N-drift region; a plurality of first contacts on the n+ drain arranged along a longitudinal direction; a P-body on the N-well; a source on the P-body, the source comprising a plurality of n+ doped regions and at least one p+ doped region arranged along the longitudinal direction; a plurality of second contacts on the plurality of n+ doped regions and the at least one p+ doped region; a polygate on the P-body; and a gate oxide between the polygate and the source.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
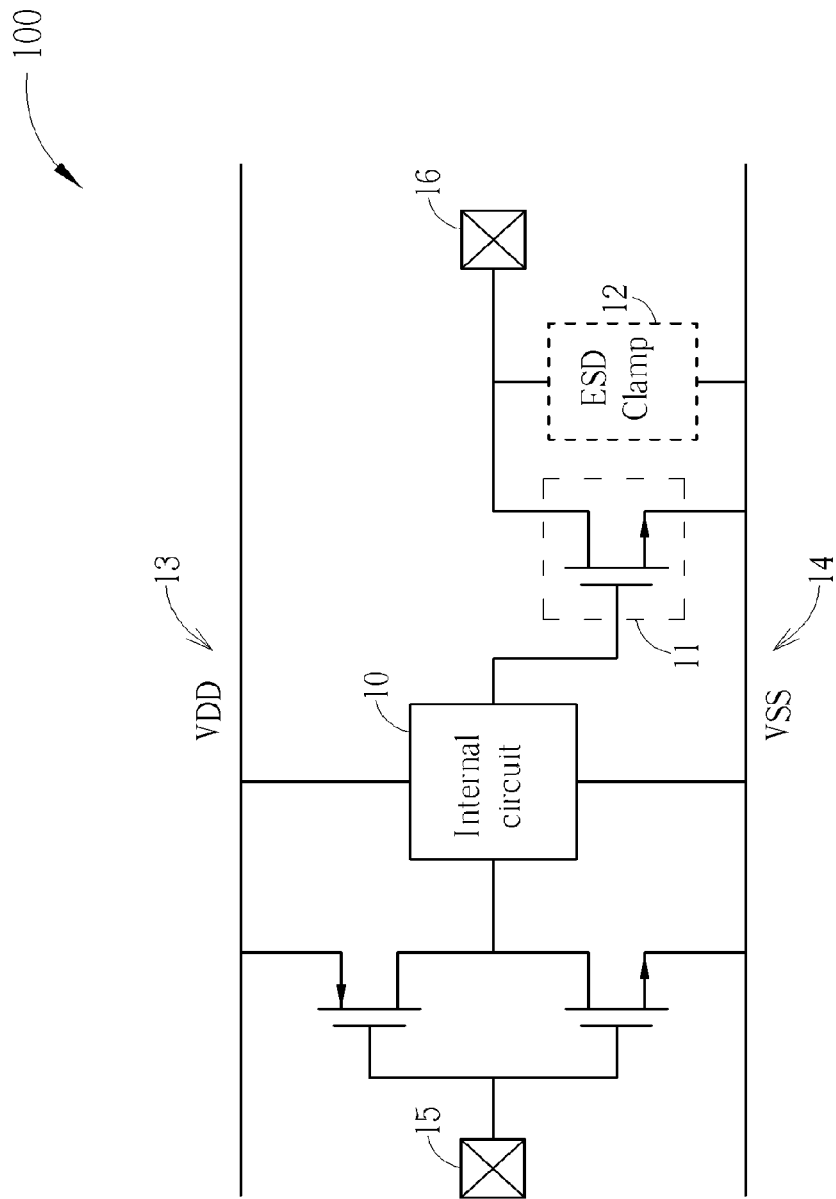
FIG. 1 shows a prior art open drain circuit.
Figure 2:
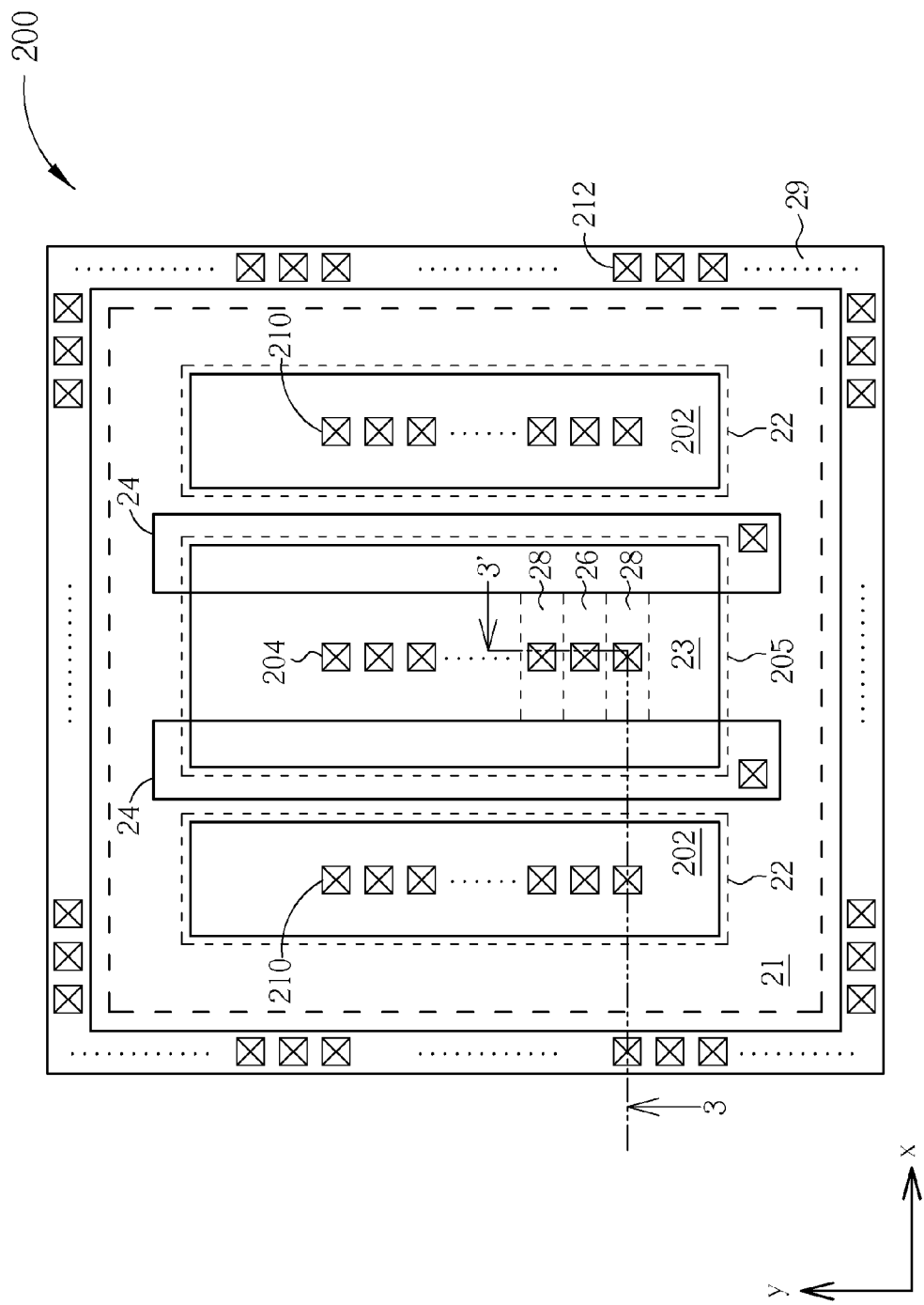
FIG. 2 shows an NMOS transistor according to an embodiment of the present invention.
Figure 3:
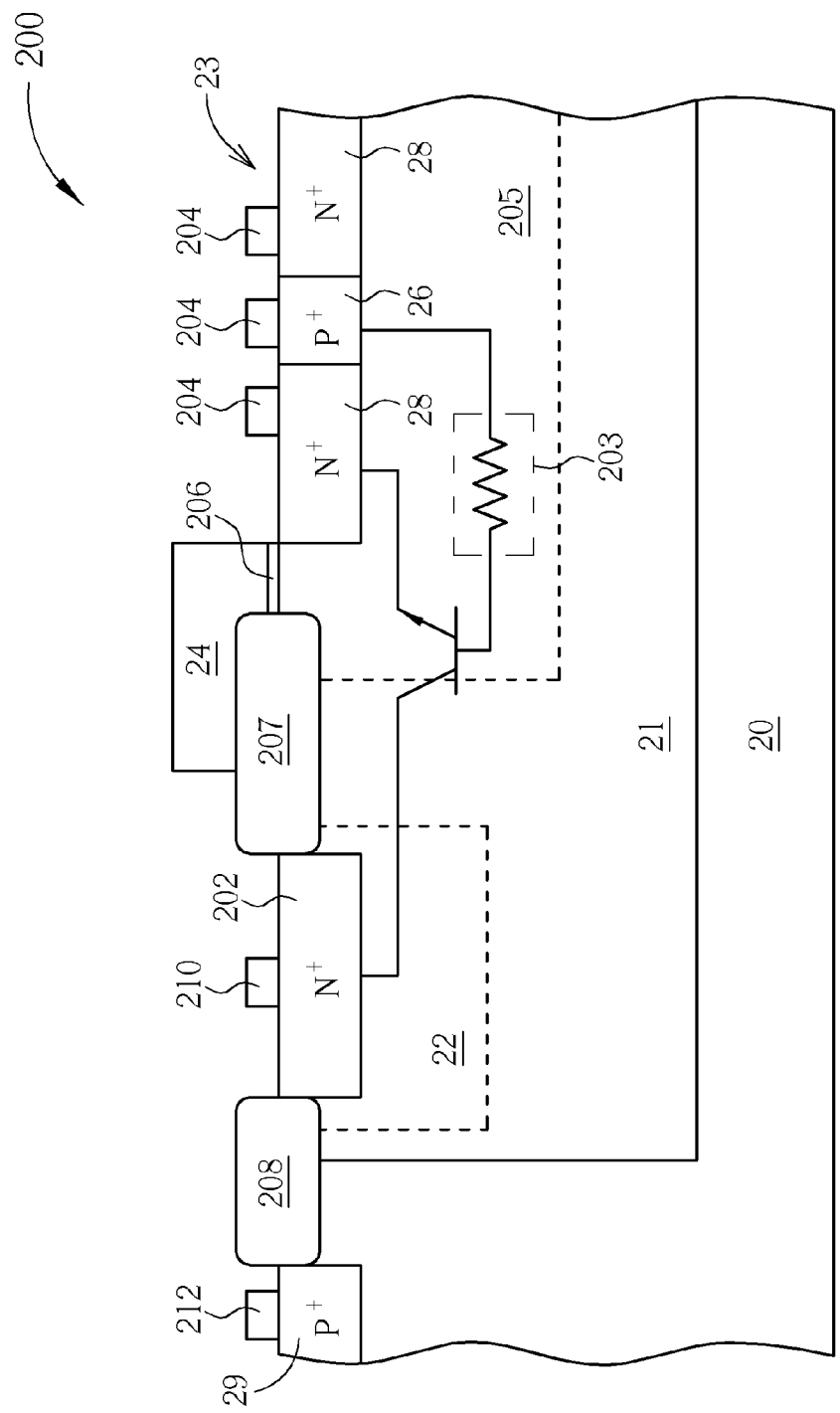
FIG. 3 is a cross-sectional view of the NMOS transistor along line 3-3' depicted in FIG. 2.

Please refer to FIGS. 2 and 3. FIG. 2 shows an NMOS transistor 200 according to an embodiment of the present invention. FIG. 3 is a cross-sectional view of the NMOS transistor 200 along line 3-3' depicted in FIG. 2. The NMOS transistor 200 can be an LDNMOS transistor. The NMOS transistor 200 comprises a P-substrate 20, a deep N-well 21 formed on the P-substrate 20, two N-drift regions 22 formed on the deep N-well 21, a P-body 205 formed in the deep N-well 21 and a source 23 formed on the P-substrate 205. The Source 23 in FIGS. 2 and 3 includes a plurality of n+ doped region 28 and at least a first p+ doped region 26. Contacts 204 are formed on each n+ doped region 28 and each first p+ doped region. The polygate 24 is further formed on the P-body 20, and a gate oxide 206 is formed between the polygate 24 and the source 23. An n+ drain 202 is formed on each of the N-drift regions 22, and a plurality of contacts 210 are formed thereon along a longitudinal direction as depicted along a y-axis, perpendicular to an x-axis, in FIG. 2. A first field oxide 207 is formed between the n+ drain 202 and the polygate 24. In addition, a second p+ doped region 29 with a ring shape is formed on the P-substrate 20, and a plurality of contacts 212 arranged along the ring shape are formed thereon. The second p+ doped region 29 is used as a guard ring to protect the elements on the P-substrate 20, and the p+ doped region 29 and the N-drift regions 22 are separated by a second field oxide 208.

The n+ doped regions 28 of the source 23 and the first p+ doped region 26 are arranged along a longitudinal direction as depicted along the y-axis in FIG. 2. Through the longitudinal arrangement, the space between the contacts 204 can be increased. As shown in FIGS. 2 and 3, the plurality of contacts 204 of the doped regions 26, 28 on the source 23 are separated from one another. Therefore, when the spaces between the contacts 204 increase, the internal resistance 203 between the source 23 and the N-drift regions 22 will also increase, thereby decreasing the trigger voltage of the NMOS transistor 200.

Figure 4:
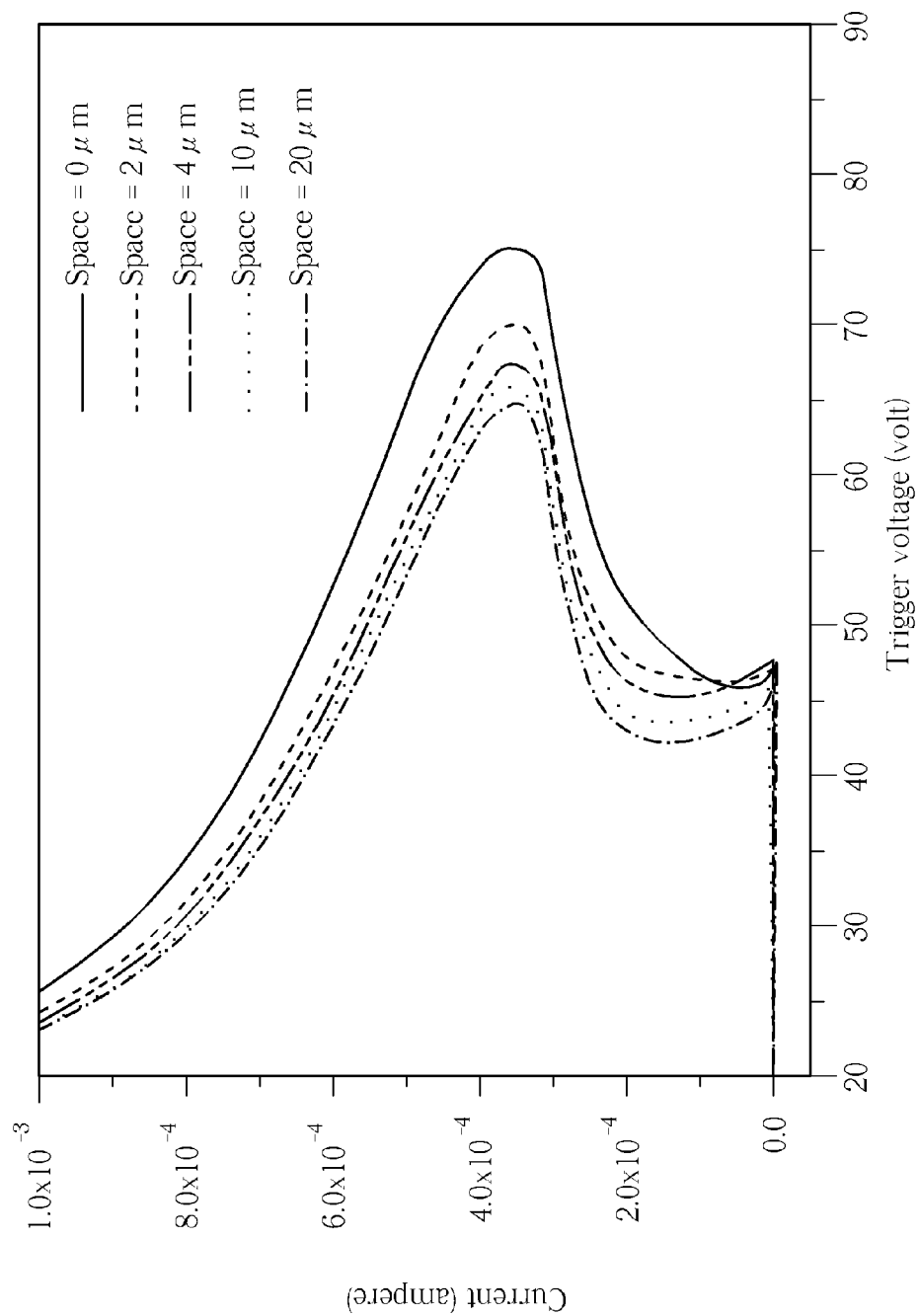
FIG. 4 shows the relationship between the current and the trigger voltage of the NMOS transistor in FIG. 2.

Please refer to FIG. 4, FIG. 4 shows the relationship between the current and the trigger voltage of the NMOS transistor 200. It can be observed from FIG. 4 that under the same current condition, when the space between the contacts 204 increases, the trigger voltage of the NMOS transistor 200 decreases.

Figure 5:
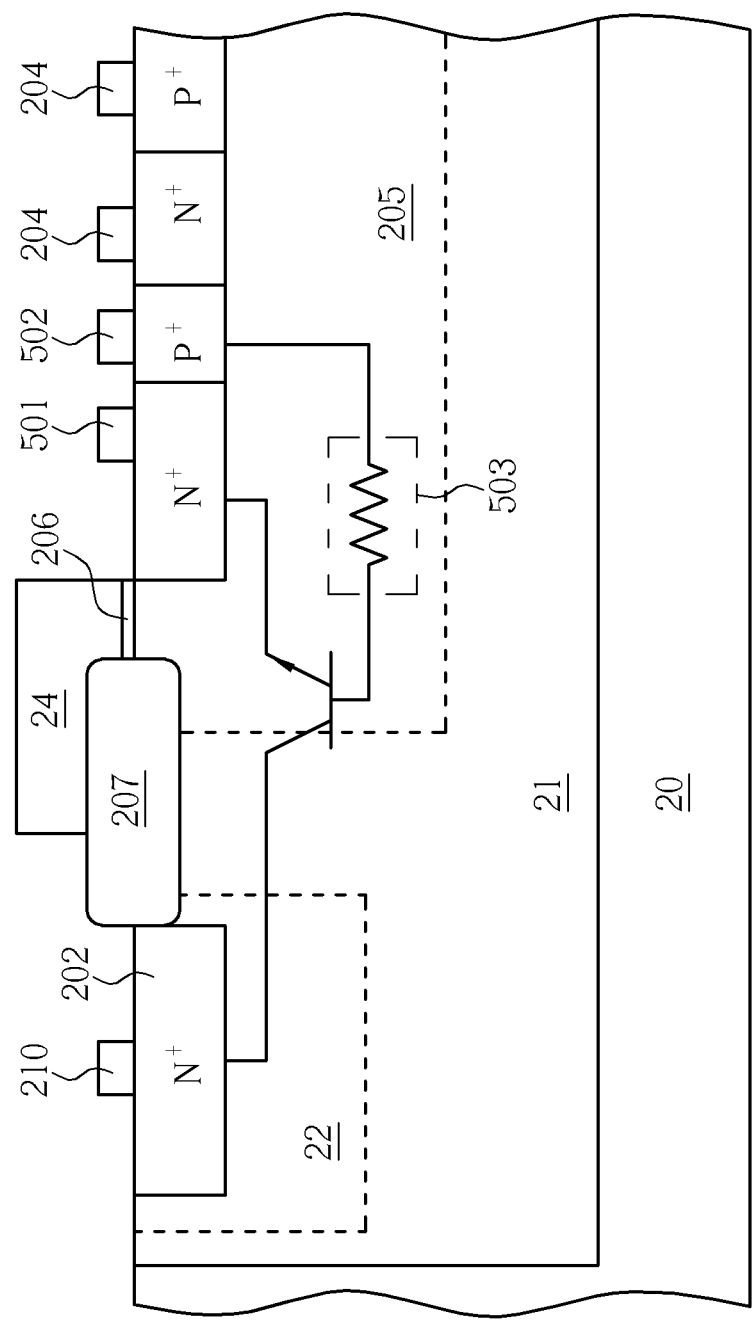
FIGS. 5 and 6 show the relationship between the space between contacts and internal resistance of the NMOS transistor in FIG. 2.

Please refer to FIG. 5, FIG. 5 shows the relationship between the space between contacts 501, 502 and internal resistance of the NMOS transistor 200 in FIG. 2. The internal resistance 503 is proportional to the distance between the first valid contact 501 and the second valid contact 502. Because the space between the first valid contact 501 and the second valid contact 502 is smaller in FIG. 5, the internal resistance 503 is smaller, and the trigger voltage of the NMOS transistor 200 is slightly reduced.

Figure 6:
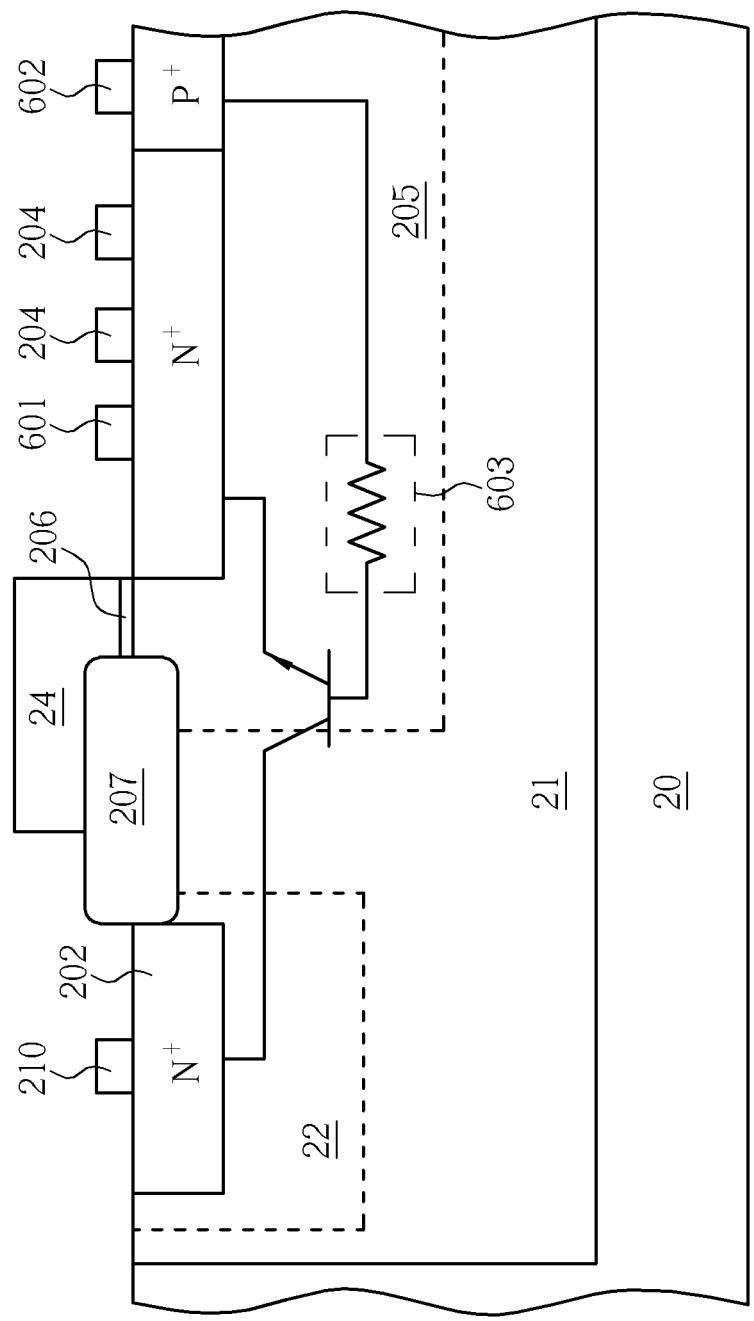

Please refer to FIG. 6, FIG. 6 shows the relationship between the space between contacts 601, 602 and internal resistance of the NMOS transistor 200 in FIG. 2. The internal resistance 603 is proportional to the distance between the first valid contact 601 and the second valid contact 602. Because the space between the first valid contact 601 and the second valid contact 602 is larger in FIG. 6, the internal resistance 603 is larger, and the trigger voltage of the NMOS transistor 200 is greatly reduced.

In view of above, the n+ doped regions 28 and the at least one first p+ doped region 26 of the source 23 are arranged along a longitudinal direction, thus the space between the contacts 204 of the source 23 can be increased, thereby reducing the trigger voltage of the NMOS transistor 200 without changing the breakdown voltage. Thus a high performance ESD clamp can be obtained to protect circuit elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An NMOS (n-type metal-oxide-semiconductor) comprising:
    a P-substrate;
    an N-well on the P-substrate;
    an N-drift region on the N-well;
    an n+ drain on the N-drift region;
    a plurality of first contacts on the n+ drain arranged along a longitudinal direction;
    a P-body on the N-well;
    a source on the P-body, the source comprising a plurality of n+ doped regions and at least one p+ doped region arranged along the longitudinal direction;
    a plurality of second contacts on the plurality of n+ doped regions and the at least one p+ doped region, wherein the plurality of second contacts on the plurality of n+ doped regions and the at least one p+ doped region are separate from one another;
    a polygate on the P-body; and
    a gate oxide between the polygate and the source.

2. The NMOS of claim 1 further comprising a field oxide between the n+ drain and the polygate.

3. The NMOS of claim 1 wherein at least one second contact is formed on each of the n+ doped regions.

4. The NMOS of claim 1 further comprising a P-well encircling the N-well on the P-substrate.

5. The NMOS of claim 4 further comprising a p+ guard ring on the P-well.

6. The NMOS of claim 5 further comprising a plurality of third contacts on the p+ guard ring.

7. The NMOS of claim 5 further comprising a field oxide formed between the p+ guard ring and the N-well.

8. The NMOS of claim 1 wherein the N-well is a deep N-well.

9. The NMOS of claim 1 wherein the plurality of first contacts are each disposed only on the n+ drain arranged along the longitudinal direction.

10. The NMOS of claim 1 wherein the n+ drain is formed directly above the N-drift region.

* * * * *